(12) United States Patent
Hoang

(10) Patent No.: US 6,284,601 B1
(45) Date of Patent: Sep. 4, 2001

(54) METHOD FOR FABRICATING ELECTRICALLY SELECTABLE AND ALTERABLE MEMORY CELLS

(75) Inventor: Loc B. Hoang, San Jose, CA (US)

(73) Assignee: Winbond Memory Laboratory, San Jose, CA (US)

( * ) Notice: Subject to any disclaimer, the term of this patent is extended or adjusted under 35 U.S.C. 154(b) by 0 days.

(21) Appl. No.: 09/285,945

(22) Filed: Apr. 1, 1999

Related U.S. Application Data

(62) Division of application No. 08/884,827, filed on Jun. 30, 1997.

(51) Int. Cl.[7] .............................................. H01L 21/8247
(52) U.S. Cl. .......................................... 438/258; 438/267
(58) Field of Search .................................... 438/257, 258, 438/264, 266, 267, 596

(56) References Cited

U.S. PATENT DOCUMENTS

| | | | |
|---|---|---|---|
| 4,833,646 | 5/1989 | Turner | 365/208 |
| 4,870,615 | 9/1989 | Maruyama et al. | 257/321 |
| 5,029,130 | 7/1991 | Yeh | 365/186 |
| 5,045,488 | 9/1991 | Yeh | 438/257 |
| 5,067,108 | 11/1991 | Jenq | 257/316 |
| 5,202,850 | 4/1993 | Jenq | 257/316 |
| 5,216,268 * | 6/1993 | Chen et al. | 257/315 |
| 5,242,848 | 9/1993 | Yeh | 438/266 |
| 5,278,087 | 1/1994 | Jenq | 438/264 |
| 5,557,566 | 9/1996 | Ochii | 257/316 |
| 5,572,054 | 11/1996 | Wang et al. | 257/322 |
| 5,646,060 * | 7/1997 | Chang et al. | 438/258 |
| 5,801,414 | 9/1998 | Shinmori | 257/414 |

* cited by examiner

*Primary Examiner*—Chandra Chaudhari
(74) *Attorney, Agent, or Firm*—Oppenheimer Wolff & Donnelly LLP; Claude A. S. Hamrick; Anthony Diepenbrock

(57) ABSTRACT

A fabrication method is disclosed for fabricating a memory cell comprised of three regions of a first-type deposited on a substrate of a second-type, a first insulating layer deposited over the substrate, a floating gate disposed over the first insulating layer, a second insulating layer disposed over the floating gate and the first insulating layer, a control gate disposed over the second insulating layer and partially extending over the floating gate, and a select gate disposed over the second insulating layer. The memory cell can be configured in four different ways. When placed in a memory array, a predefined number of memory cells can be grouped into blocks. By using a byte(block)-select transistor, the memory cells can be accessed and altered on block by block basis. The novel memory cells can be manufactured without requiring additional processing steps aside from those required in the manufacturing of the comparable flash memory cells.

11 Claims, 9 Drawing Sheets

METHOD FOR FABRICATING ELECTRICALLY SELECTABLE AND ALTERABLE MEMORY CELLS

CROSS-REFERENCE TO RELATED APPLICATIONS

This application is a divisional of application Ser. No. 08/884,827, filed Jun. 30, 1997, and entitled "ELECTRICALLY SELECTABLE AND ALTERABLE MEMORY CELLS".

FIELD OF INVENTION

The present invention relates generally to methods for fabricating electrically programmable non-volatile memory cells and arrays, and, more particularly, to a method for fabricating electrically erasable programmable non-volatile memory cells and arrays where memory cells in a memory array can be selectively altered on a byte-block basis.

BACKGROUND OF THE INVENTION

There are several types of memory cell structures in the field of non-volatile memory.

One type of non-volatile memory uses a storage transistor having a so-called floating gate. The floating gate is generally fabricated between the control gate and the substrate and is not directly connected to any terminals or any specific structures. If the floating gate is neutral (no or minimal charges stored), it does not affect the electric field generated by the control gate that affects the channel region between the source and drain terminals. In effect, the storage transistor operates like a normal MOS transistor. If the floating gate is charged (storing electrons), the electrons in the floating gate react to the electric field generated by the control gate and generate an electric field in the channel region that is opposite in polarity to the electric field generated by the control gate. From this technology, a class of non-volatile memory devices known as electrically erasable programmable read only memory or EEPROM has been developed.

Referring to FIG. 1a, one type of EEPROM storage transistor cell structure is the FLOTOX (Floating Gate Tunnel Oxide) cell structure. Here, there is a polysilicon control gate 10 where a control voltage $V_{CG}$ may be applied, a polysilicon floating gate 12, a source terminal having a source voltage potential $V_S$, a drain terminal having a drain voltage potential $V_D$, and another polysilicon 14 over two n-type regions, 16 and 18, forming a select transistor. An inter-poly dielectric region 26 is defined between the two polysilicon pieces 10 and 12 (control gate and floating gate); two gate-dielectric regions 28 and 32 are defined by the respective polysilicon areas; and a tunnel dielectric region is defined by the tunnel window region 22 of the polysilicon piece 12 (floating gate). Due to the unique shape of the control gate 10 and the floating gate 12, a tunnel window region 22 is defined to allow the tunneling of electrons. This cell structure may be schematically represented as in FIG. 1b where a FLOTOX transistor 36 is coupled with a select transistor 38. In operation, the select transistor 38 has to be turned on in order to operate the FLOTOX transistor 36.

Programming of the FLOTOX memory cell is carried out by applying a relatively high voltage pulse between the control gate 10 and the drain terminal 18 when there is a positive voltage applied at the select gate terminal 14. The high voltage pulse initiates carrier generation in the substrate and causes electrons to penetrate the tunnel-dielectric region 30 and accumulate in the floating gate 12. In a likewise manner, in erasing the memory cell, an inverse voltage is applied between the gate and drain terminals. Thus, the negative electrons in the floating gate are drawn to the drain through the thin tunnel oxide.

The erase and program operations are achieved by taking advantage of the Fowler-Nordheim tunneling mechanism occurring between the floating gate 12 and the silicon substrate 24 through a thin oxide called the tunnel oxide 30. A tunnel window 22 defines the area of the tunnel oxide where a large tunnel window would improve the speed of the erase/program operation but would also increase the cell size as well. A thinner tunnel oxide region 30 would reduce the tunneling voltage requirement and reduce the erase/program operation time. However, such a memory cell is more difficult to manufacture and may have greater reliability problems.

There are several problems with the FLOTOX memory cell. The memory cell requires a conductive n-type region on the p-type substrate 24 directly below the tunnel window area 22. Since this n-type region can not be fabricated by the self-alignment method, it requires an additional processing step which translates to higher processing cost and lower yield. Additionally, an electric field of about 10 mega volt per centimeter is required for tunneling to occur through the oxide, which translates to a voltage potential difference between the control gate and the drain terminal in the range from 16 volts to 20 volts. This is a relatively high voltage requiring special drain and source formation (at the drain 18 and source 34 terminals for the select transistor and at the drain terminal 34 for the FLOTOX transistor). These high voltage junctions would in turn require the select transistor to have a longer channel or have an overall larger area. The traditional FLOTOX erase and program operation time are typically in the range of 1 ms to 3 ms each with approximately 18 to 20 volts applied. The total write time for this type of memory cell is 10 ms maximum.

Referring to FIG. 2a, another important type of non-volatile memory is the flash memory. In a flash memory cell, there is a drain (40 or 42) and source (40 or 42) region deposited on and within a substrate 44. An insulating layer is deposited over the substrate and the drain and source regions, 50 and 52. Over the insulating layer, a floating gate 48 is disposed in such a manner to partially overlap one of the regions. A second insulating layer is then deposited over the floating gate 48. A control gate 46 is then disposed over the floating gate 48 and partially overlapping the other region.

In operation, the flash memory cell is erased when the drain and source terminals are connected to ground and a high voltage is applied at the control gate 46, causing electrons in the floating gate 48 to tunnel to the control gate 46. Comparing the tunneling process occurring in the FLOTOX memory cell, the tunneling of electrons here is a faster process requiring lower voltage potential across the respective terminals. Additionally, the typical erase time for the flash memory cell is less than 1 ms with approximately 14 volts applied. The erase time and/or (lower) voltage potential can be further improved by modifying and optimizing the dimensions of the memory cell.

To program the memory cell, the control gate 46 is set to be barely-on (around 2 volts), the terminal connected to region 40, away from the floating gate 46, is connected to ground, and the terminal connected to region 42 closer to the floating gate 46 is provided with a high voltage, generally around 12 volts. In this manner, an electric field is generated in the direction of region 40 away from the floating gate, causing electrons to travel through the channel region and be injected into the floating gate 48, thereby charging the gate and programming the memory cell. The flow of the electrons in this process called hot carrier injection is as illustrated by the arrows. The programming operation by hot electron injection provides a much faster programming time when compared with the programming time of traditional FLO-TOX programming operations. The typical programming time for a flash memory cell is in the range of 1 us (micro-second) to 100 us depending on the process, the device size, and the voltage potential applied, while the typical programming time for the FLOTOX memory cell is around 3 ms. The flash memory cell is a much faster device where time for writing data into the memory cell ($T_{write}$) equals the time to erase the data in the memory cell ($T_{erase}$) which is about 1 ms plus time to program the memory cell ($T_{prog}$) which is about 100 us. This time is faster than the write time for the FLOTOX memory cell. Moreover, a major advantage of the flash memory is that from a processing point of view, the flash memory cell requires fewer and less difficult processing steps since the self-alignment method can be used. The schematic representation of the FIG. 2a is illustrated in FIG. 2b which is the circuit symbol for the flash memory cell.

However, when flash memory cells are placed in a memory array, they have to be operated in a certain manner. Referring to FIG. 3a, a memory array 60 having a plurality of interconnected flash memory cells arranged in rows and columns is illustrated. Here, the flash memory cells are connected in such a manner that the terminals closer to the floating gates are designated as the source terminals and are connected to a single junction. The control gates of the memory cells along the same row are connected to the same word line, e.g. WL0, WL1, etc. The word lines are controlled and operated by a row address decoder 62 in response to a given row address. In a similar manner, the drain terminals of the memory cells along the same columns are connected to the same bit line, e.g. BL0, BL1, etc. The bit lines are controlled and operated by a column decoder 64 in response to a given column address (Y-MUX is a column address line multiplexer). In a read operation, the signals are amplified by a sense amplifier 66 and put into an output buffer 68. In a program operation, data is first stored in an input buffer 70 before it is passed through the column decoder 64 for storage. In order to properly program data into the memory cells, data stored in the memory cells on the same row will have to be erased before the program operation. The reason here is that the control gate of the memory cells on the same row are connected to the same word-line hence will be affected as a group. In comparison, in such a memory array using flash memory cells, the memory cells have to be altered on a large block basis (here the entire row) while a memory array using FLOTOX memory cells can be altered on a byte to byte basis. When a memory array is altered on a block basis, invariably, some of the data that does not need to be altered has to be rewritten back into the memory array which consumes time and power in the process.

VS—Source Voltage during a read or erase operation where the low potential voltage is approximately 0 volt;

Ve—Control Gate (CG) Erase Voltage required for F-N tunneling which is generally approximately 15 volts, depending on the process used;

Vp—Program Voltage applied to the drain (or source near FG side) of the memory cells; typical value is +12V depending on the process used;

Vcgp—CG Program Voltage, higher than the erased-cell Vte (~1.5V typical) to turn on the selected cells; Vcgp is about +2V;

Vte—Threshold Voltage for a cell that has been erased;

Vdp0—Drain Program Voltage to program the selected cells with a logical data value of "0"—meaning storing electrons into the FG Vdp0 can be either Vp(12V) or Vs(+0V) depending on the array and cell configurations;

Vdp1—Drain Program Voltage to program the selected cells with a logical data value of "1" which is the same as "program-inhibit" or do not store electrons into the FG) Vdp1 can be either Vs(0V) or Vcc(5V) depending on the array and cell configuration;

Vcgr—CG Read Bias Voltage with typical value of about +4V depending on the process and design;

Vdr—Drain Read Bias Voltage with typical value of about +1.5V to +2V;

Vcc—Power Supply Voltage typically of +5V, depending on product and design;

Vwle—Erase Word Line (WL) Voltage which is >=Ve+Vt (of Byte select transistor) typically and approximately +17V (assume Vt of ~+2V); Note that Vwle and Ve can be the same (Vwle=Ve=+17V) such that the actual voltage on the CG of the memory cells is (=Vwle−Vt) which is adequate for F-N tunneling;

Vwlp—Program WL Voltage for some of the disclosed EEPROM array (which require Vp=12V on the selected BL's); this Vwlp>=Vp+Vt or about 15V typically;

Vt—Transistor Threshold Voltage.

To operate the memory array of FIG. 3a where flash memory cells (illustrated in FIG. 2a) are used and are configured such that the terminal near the floating gate is designated as the source terminal, Table 1a lists the voltage levels for the respective operations:

TABLE 1a

| | Drain (BL) | | Control Gate - CG (WL) | | Source (Common Source) |
|---|---|---|---|---|---|
| | Select | Non-Select | Select | Non-Select | |
| Erase | Vs (~0 V) | Vs (~0 V) | Ve (~15 V) | Vs (~0 V) | Vs (~0 V) |
| Program | Vdp0/Vdp1 (~Vs/~Vcc) | Vcc (~5 V) | Vcgp (~2V) | Vs (~0 V) | Vp (~12 V) |
| Read | Vdr (~2 V) | Vs (~0 V) | Vcgr (~4 V) | Vs (~0 V) | Vs (~0 V) |

The following definitions and notations are used in this disclosure to explain the operating characteristics of the various memory cells and arrays described herein:

In a likewise manner, to operate the memory array of FIG. 3b where flash memory cells (illustrated in FIG. 2a) are used and are configured such that the terminal near the floating gate is designated as the drain terminal, Table 1b lists the voltage levels for the respective operations:

TABLE 1b

|  | Drain (BL) | | Control Gate - CG (WL) | | Source (Common Source) |
| --- | --- | --- | --- | --- | --- |
|  | Select | Non-Select | Select | Non-Select |  |
| Erase | Vs (~0 V) | Vs (~0 V) | Ve (~15 v) | Vs (~0 V) | Vs (~0 V) |
| Program | Vdp0/Vdp1 (~Vp/~Vs) | Vs (~0 V) | Vcgp (~2 V) | Vs (~0 V) | Vs (~0 V) |
| Read | Vdr (~2 V) | Vs (~0 V) | Vcgr (~4 V) | Vs (~0 V) | Vs (~0 V) |

The flash memory cell structure requiring fewer and less difficult processing steps in the manufacturing process and providing faster erase and program time is the preferred non-volatile memory cell. However, when placed in an array, flash memory cells have to be altered on a large block basis even when part of the data does not need to be altered. Consequently, even unaltered data is required to be rewritten back to the memory cells—consuming power and time in the process.

It is therefore desirable to have a memory cell with all the advantages of a flash memory cell that can be altered on a block-by-block basis, where block size is predefined.

SUMMARY OF THE INVENTION

It is an object of the present invention to provide a method for fabricating memory cells with fast operational time.

It is another object of the present invention to provide a method for fabricating memory cells with minimal number of processing steps.

It is yet another object of the present invention to provide a method for fabricating memory cells and array where the memory cells in the memory array can be altered on a block-by-block basis where block size is predefined.

Briefly, a presently preferred embodiment of a memory cell in accordance with the present invention comprises three regions of a first-type deposited on a substrate of a second-type, a first insulating layer deposited over the substrate and the regions, a floating gate and a control gate separated by a second insulating layer disposed over two of said regions, and a select gate disposed over two other regions. When placed in a memory array, a predefined number of memory cells can be grouped into blocks. By using a byte-select transistor, the memory cells can be accessed and altered on block by block basis. The novel memory cell structures of the present invention do not require additional processing steps aside from those required in the manufacturing of the comparable flash memory cells, and their erase and program operation times are comparable to that of comparable flash memory cells.

An advantage of the present invention is that it provides a method for fabricating memory cells with fast operational time.

Another advantage of the present invention is that it provides a method for fabricating memory cells with minimal number of processing steps.

Yet another advantage of the present invention is that it provides a method for fabricating memory cell structures and arrays where the memory cells in the memory array can be altered on a block-by-block basis where the block size is predefined.

These and other features and advantages of the present invention will become well understood upon examining the figures and reading the following detailed description of the invention.

IN THE DRAWINGS

FIG. 2b illustrates the schematic symbol for the flash memory cell of FIG. 2a;

FIG. 4b illustrates the schematic symbol for the memory cell of FIG. 4a;

DETAILED DESCRIPTION OF THE PREFERRED EMBODIMENTS

Figure 1A:
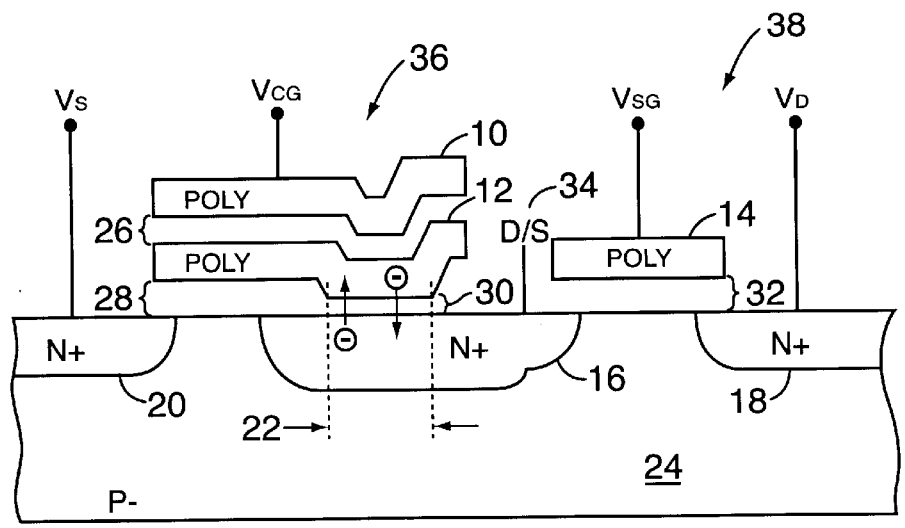
FIG. 1a illustrates a cross-sectional side view of a conventional FLOTOX type memory cell.
Figure 1B:
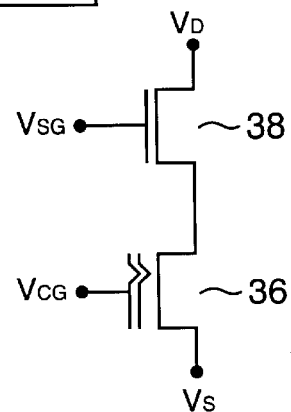
FIG. 1b illustrates the schematic symbol for the conventional FLOTOX type memory cell.
Figure 2A:
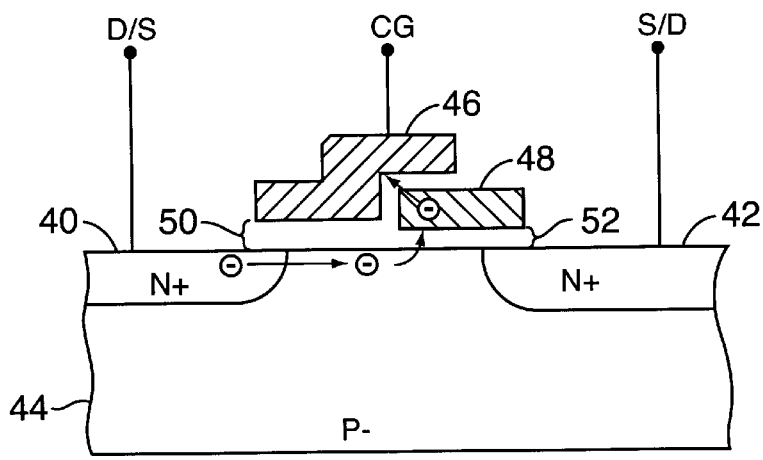
FIG. 2a illustrates a cross-sectional side view of a traditional flash memory cell.
Figure 2B:
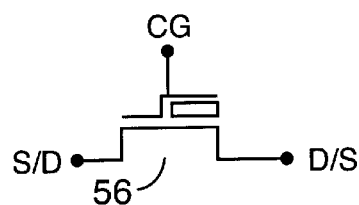
Figure 3A:
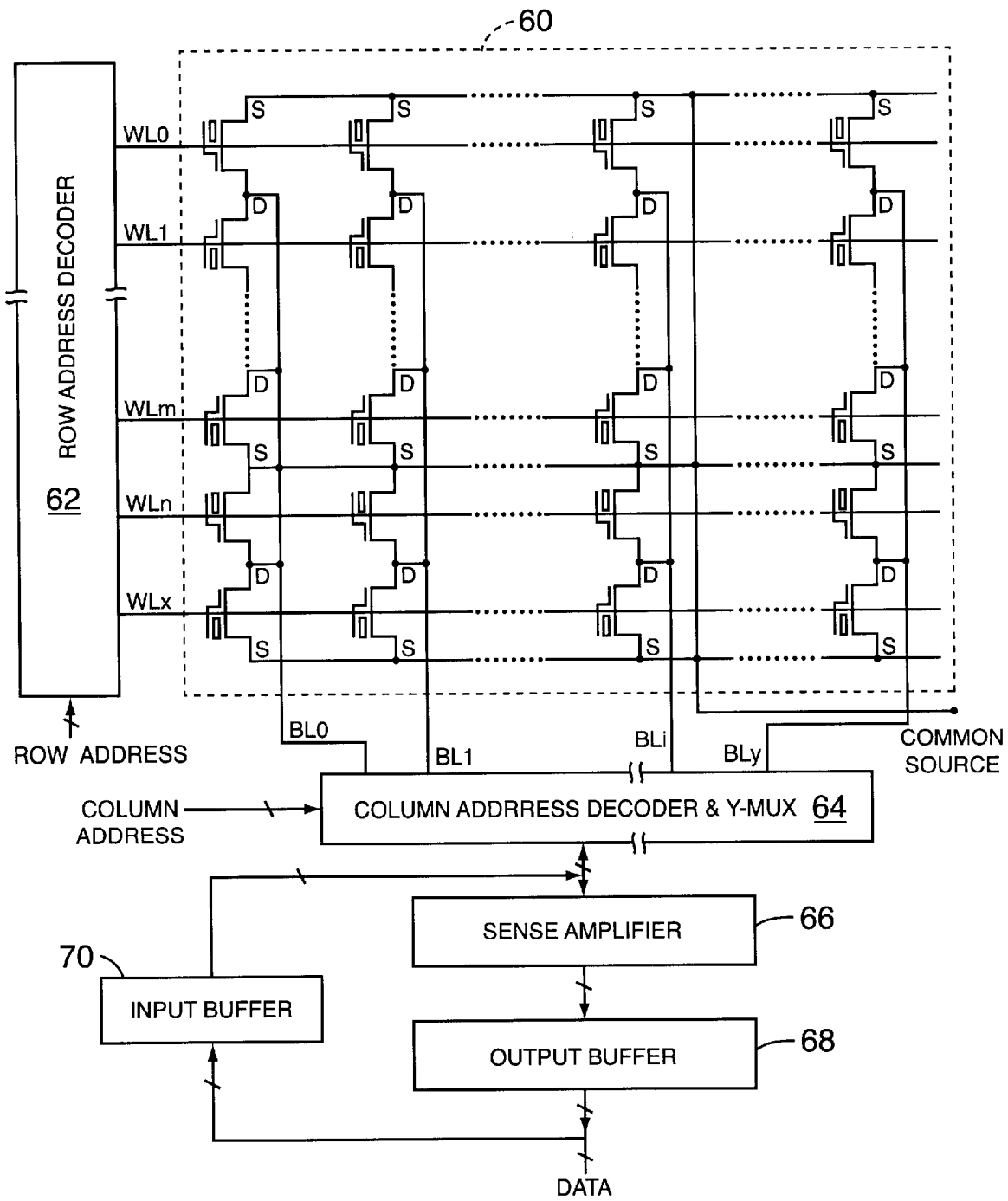
FIG. 3a illustrates a schematic diagram of a memory array comprised of traditional flash memory cells where the terminal near the floating gate is connected as the source terminal.
Figure 3B:
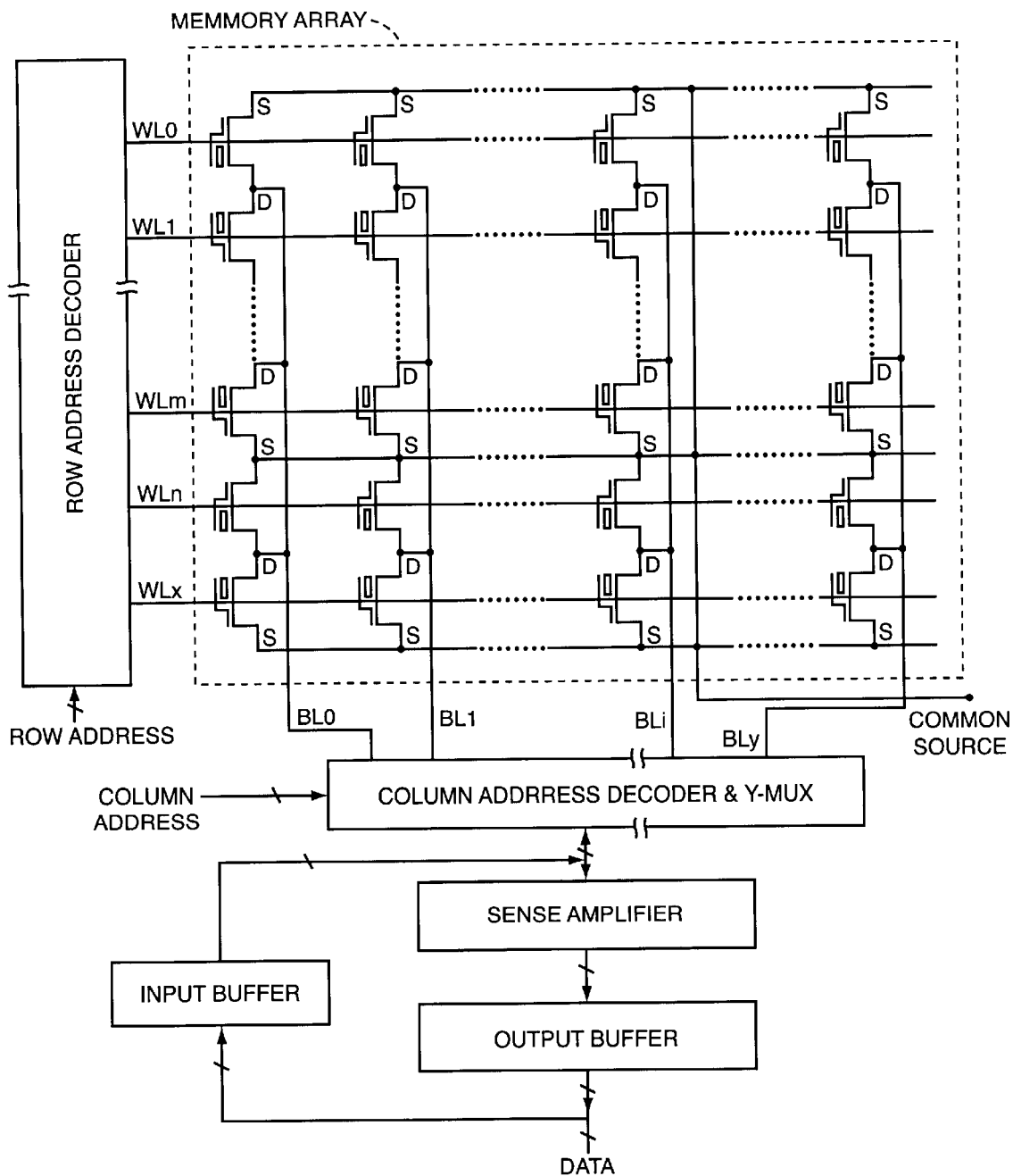
FIG. 3b illustrates a schematic diagram of a memory array comprising of traditional flash memory cells where the terminal near the floating gate is connected as the drain terminal.
Figure 4A:
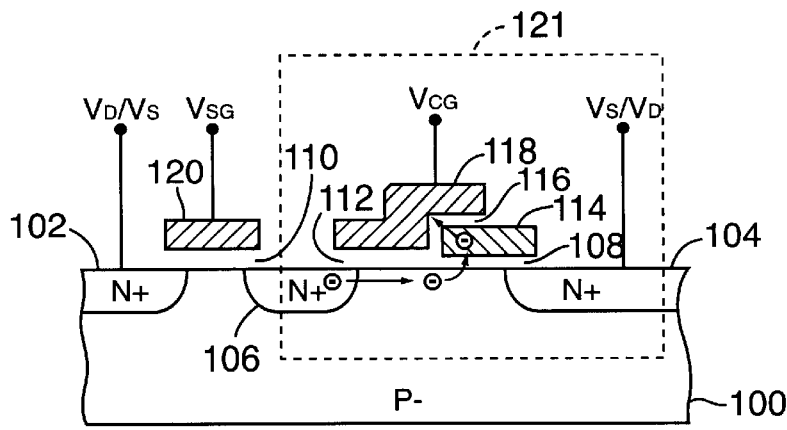
FIG. 4a shows a cross-sectional side view of a preferred embodiment of the memory cell of the present invention where a select transistor is connected to the non-floating side of a storage transistor.

Referring to FIG. 4a, a dual transistor non-volatile electrically selectable and alterable semiconductor memory cell is illustrated in a cross-section view. The cell comprises a semiconductor substrate 100 which can be a P-type silicon substrate with a typical doping level. Deposited on the substrate 100 are a drain region at 102 (or 104), a source region 104 (or 102), and a middle region 106 that forms a drain/source with respect to the respective source/drain region. As is with normal symmetrical MOS transistors, the drain 102 and source 104 terminals are interchangeable. Disposed over the substrate and the regions is a first insulating layer including a floating gate dielectric region 108, a select gate dielectric region 110, and a control gate dielectric region 112. Disposed over the first insulating layer is a floating gate 114. The floating gate 114 is positioned over a portion of region 104 and can be fabricated from polysilicon material. A second insulating layer is disposed over the floating gate 114 forming region 116 (among other regions). A step-shaped control gate 118 is generally disposed over the second insulating layer partially overlapping the floating gate 114 and partially overlapping region 106. A select gate 120 is disposed over said second insulating layer and positioned in such a manner to overlap with regions 102 and 106. The select gate can be fabricated from polysilicon material as well. The portion of the memory cell enclosed by the dashed box 121 is a non-volatile storage transistor having similar structure and properties to that of other storage transistors. The other portion of the memory cell, in particular regions 102 and 106, and select gate 120 forms a select transistor for permitting selective operation of the storage transistor. It can be viewed that the select transistor is connected to the storage transistor in series where the adjacent source and drain regions of the two transistors are combined into one common region 106.

From the processing point of view, in the fabrication of this type of memory cell, no additional processing step is required aside from those required for the fabrication of storage transistors. By maintaining the same number of processing steps, cost and reliability are maintained at about the same level.

The memory cell can be configured in one of two ways. In one configuration, region 102 is connected as the drain terminal and region 104 is connected as the source terminal. In another configuration, region 102 is connected as the source terminal and region 104 is connected as the drain terminal. In either configuration, region 106 serves as the common drain and source junction respectively.

The operation of the storage transistor is similar to that of a flash memory cell. The information (charge) in the storage transistor is erased using the Fowler-Nordheim tunneling mechanism where electron charge in the floating gate 114 is removed by grounding the source 102 and drain 104 terminals, and applying a high voltage at the control gate 118. Electrons in the floating gate 114 are induced to tunnel through the second insulating layer (region 116) to the control gate 118.

To program the storage transistor, in one configuration, the memory cell is first selected by a positive potential at the select gate 120, a threshold voltage is applied at the control gate 118 to barely turn-on the storage transistor, and a high voltage (around 12 volts) is is applied at the source terminal. Electrons flow from the drain terminal to the source terminal, accelerate, and inject into the floating gate 114. In another configuration where the drain and source terminals are reversed, the high voltage is applied at the drain terminal and electrons flow from the source terminal to the drain terminal, accelerate, and inject into the floating gate 114. The path generally undertaken by the electrons is as illustrated in the figure.

In a read operation, the designated source terminal is grounded, and conventional transistor read voltages such as +2 volts and +5 volts are applied to the designated drain region and the control gate, respectively. If the floating gate is not charged and when the control gate is raised to the read potential, the channel conducts causing electrical current to flow from the designated drain region to the designated source region, and such operation can be translated to a first logical state. On the other hand, if the floating gate is charged, the channel region beneath the floating gate is either weakly turned on or is entirely shut off when a voltage potential is applied at the control gate. Even when the control gate and the drain region are raised to the read potential, little or no current will flow through the portion of the channel region directly beneath the floating gate. In this case, the current is either very small or non-existent and can be translated to a second logical state.

Figure 4B:
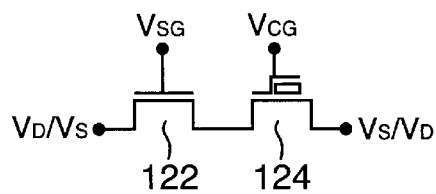

FIG. 4b illustrates the schematic representation for this memory cell where there is a select transistor 122 connected in series with a storage transistor 124, the select transistor being located away from the floating gate of the storage transistor.

Figure 4C:
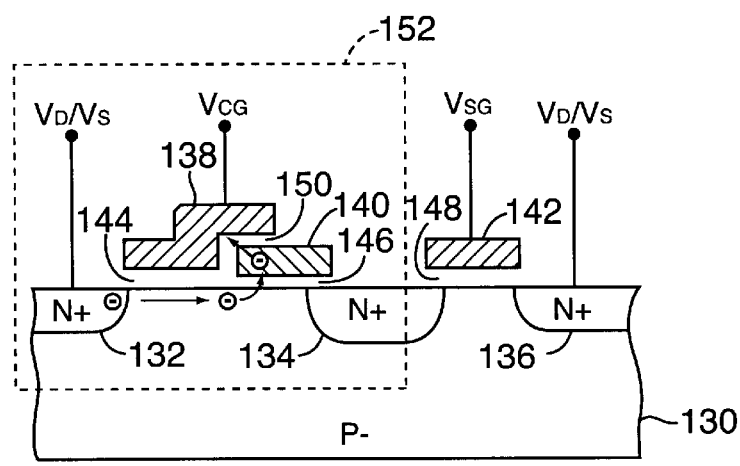
FIG. 4c illustrates a cross-sectional side view of an alternate embodiment of the memory cell of the present invention where a select transistor is connected to the floating side of a storage transistor.

Referring to FIG. 4c, an alternate embodiment of the present invention is illustrated. Here, in a like fashion, there are three regions, 132, 134, and 136, diffused into a substrate 130. A first insulating layer, including regions 144, 146, and 148, is generally deposited over the substrate 130. Regions 132 and 136 can be interchangeably designated as the drain or source terminals giving rise to two configurations. A floating gate 140 is disposed over the first insulating layer. A second insulating layer is disposed over the floating gate. A control gate 138 is disposed over the second insulating layer and extension a portion of the floating gate 140. A select transistor is disposed over the second insulating layer as well. In effect, in this memory cell embodiment, a select transistor is formed in series with a storage transistor 152. This memory cell structure is different from the memory cell structure of FIG. 4a in that the select transistor is connected at the floating gate end of the storage transistor rather than at the control gate end of the storage transistor. The operational method for this memory cell structure is similar to the operational method for the memory cell structure described above. The region beneath the floating gate is generally deeper and therefore creates a greater overlap through lateral diffusion with the floating gate.

Figure 4E:
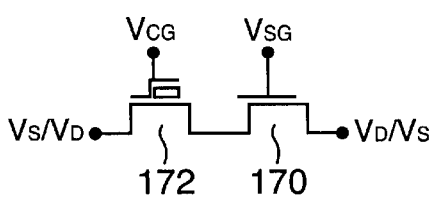
FIG. 4e shows the schematic symbol for the memory cells of FIGS. 4c and 4d.
Figure 4D:
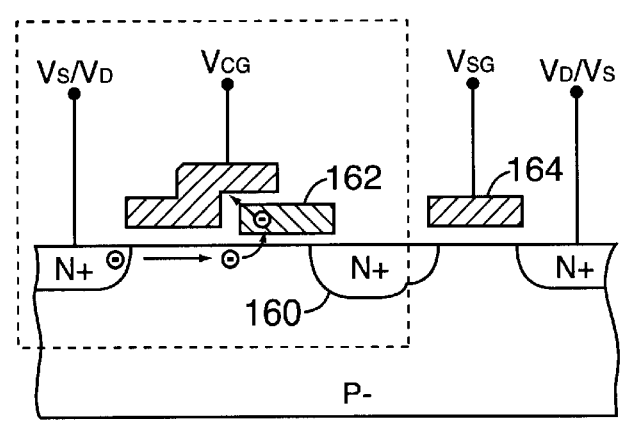
FIG. 4d illustrates yet another cross-sectional side view of the alternate embodiment of FIG. 4c where the region near the floating gate is tailor shaped to minimize select transistor cell size.

FIG. 4d illustrates a variation of the memory cell embodiment of FIG. 4c where the middle N+ doped region 160 is formed in a shape tailored to the special characteristics of the floating gate 162 and the select gate 164. Since only more overlap is needed underneath the floating gate, by providing such a shaped region, the channel length for the select transistor can be reduced to provide an overall smaller cell size. FIG. 4e illustrates the schematic symbol for the memory cell structure of FIGS. 4c and 4d.

As described above, the memory cells of the present invention can be fabricated to form two different cell structures principally differing by the location of the select transistor with respect to the floating gate of the storage transistor. Each type of memory cell structure can be configured in one of two ways; namely, the designation of the drain and source terminals. Thus, these variations give rise to four configurations for the two memory cell structures.

When used in a memory array, the operational requirements for each configuration varies. FIGS. 5a–5d illustrate the memory array arrangements for the four different configurations.

Figure 5A:
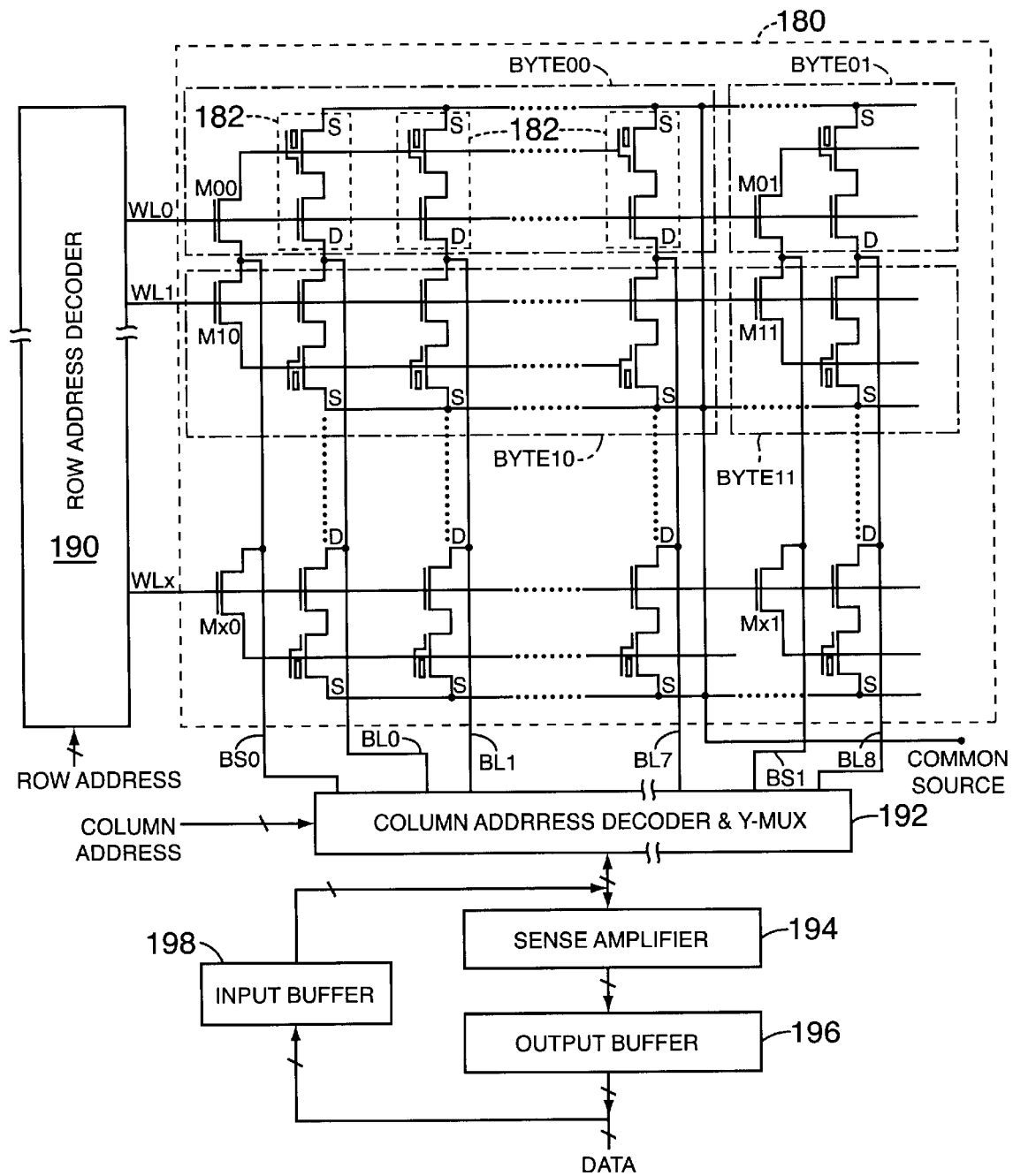
FIG. 5a illustrates a schematic diagram of a memory array of the present invention using a memory cell of the present invention where the select transistor of the memory cell is located away from the floating gate of the storage transistor of the memory cell and is connected as a drain terminal at one junction.

In FIG. 5a, a memory array 180 is comprised of a plurality of byte-blocks, e.g. byte 00, byte 01, byte 10, byte 11, etc. Each of the byte blocks includes a number of the memory cells (182) of the present invention. In this particular layout, the memory cells have a structure where the select transistor is located away from the floating gate of the storage transistor, and the terminal near the floating gate is designated as the source terminal and the terminal near the select transistor is designated as the drain terminal. In each byte-block, there is a byte-select transistor (e.g., M00, M01, M10, M10, also referred to as block-select transistor) for operating the memory cells within the byte-block. The number of memory cells within a byte-block is design dependent and is not limited to any particular number of memory cells. Here, each block contains eight cells corresponding to eight bits of data.

The byte-select transistor is connected to a byte-select line (e.g., BS0, BS1, etc.) at one terminal, a word line (e.g. WL0, WL1, etc.) at the gate terminal, and the control gate terminals of storage transistors of the memory cells within the block. Each of the memory cells within a byte-block are connected to a bit-line (e.g. BS0, BL1, BL2, etc.) at the drain terminal of the select transistor. The source terminals of the storage transistors are commonly connected. Additionally, all of the select gates of the select transistor within a byte-block are connected to the word line for the block, and all of the control gates of the storage transistor are commonly connected to one terminal of the byte-select transistor.

The word lines are in turn activated by a row decoder 190 in response to a given row address, and the byte select lines and bit lines are activated by a column address decoder 192 in response to a given column address. In the read operation, data signals read from the memory cells are amplified through a sense amplifier 194 and put into an output buffer 196. In a write operation, data to be written is first put into an input buffer 198 and then passed to the column address decoder 192 for storage.

By this arrangement, the memory cells in the array can be accessed on a byte-block by byte-block basis where a byte-block may have any number of bits (or memory cells).

CONFIGURATION 1

Memory Cell Structure with Placed Select Transistor Away From the Floating Gate and One Terminal of the Select Transistor Connected as A Drain Terminal Table 2a illustrates the corresponding voltages to operate the memory array illustrated in FIG. 5a.

Since there are four major terminals to each byte-block, there are four columns referencing the byte-select line, the bit-line, the select gate (or word line), and the source terminal. Within each column, there are two sub-columns to reference the two possible options, select or non-select. "Select" means that the particular byte-block is selected for operation and "non-select" means that the particular byte-block is not selected for operation. It is important to note that the voltage levels for the non-select blocks must be observed while the selected block is being operated.

Erase Operation

In an erase operation, for a selected byte-block, the byte-select line (BS) is set to about 15 volts, the bit line (BL) is set to 0 volt, the word line (WL) is set to about 17 volts, and the source terminal is set to 0 volt. In this manner, when selected, the byte-select transistor is activated by the WL voltage to allow current flow between the two terminals of the byte-select transistor. BS at about 15 volts is thereby applied to the control gates of the storage transistors, causing tunneling of electrons from the floating gate to the control gate, thereby removing the charge in the floating gate.

For other non-selected byte-block on the selected word line, BS is set to ground or low potential and no activity takes place. For all other non-selected byte-block, since all terminals are at zero potential, no activity takes place.

Program Operation

In a program operation for a selected byte-block, BS is set at about 2 volts, BL is at the desired voltage level for storing either a "1" (Vdp1) or a "0" (Vdp0), WL is at about 5 volts, and source terminal is at about 12 volts. In this manner, WL activates the byte-select transistor causing the BS voltage to be applied at the control gates of the storage transistors.

Since WL is at about 5 volts, BS is at about 2 volts, and the source terminal is at about 12 volts, electrons flow from the BL (at about voltage supply potential) to the channel region of the storage transistor and, through the effect of hot carrier injection, are injected to the floating gate.

For a non-selected byte-block on the same WL, BL is at about 5 volts and source is at about 12 volts and no activity takes place. For other non-selected blocks, no activity takes place.

Read Operation

In a read operation for a selected byte-block, BS is at about 4 volts, BL is at about 2 volts, WL is at about 5 volts, and common is at about 0 volt. In this manner, WL activates the byte-select transistor and the BS voltage is applied at the control gates of the storage transistors. If the memory cell is previously programmed, Vtp is high (Vcg=+4V<Vtp=7V) and it will not turn on to generate a current (other than leakage). The lack of current is then interpreted as a logical "0" state. If the memory cell is erased, Vte of the cell is low, generally at about ~1.5v to 2V. Since Vcg=+4V>Vte=1.5V, the cell conducts current and is interpreted as a logical "1" state.

For all other non-selected byte-blocks, all terminals are at about 0 volt and no activity takes place.

TABLE 2a

|  | Byte-Select (BS) | | Drain - Bit Line (BL) | | Select Gate - Word Line (WL) | | Source |
|---|---|---|---|---|---|---|---|
|  | Select | Non-Select | Select | Non-Select | Select | Non-select | (Common) |
| Erase | Ve (~15 V) | Vs (~0 V) | Vs (~0 V) | Vs (~0 V) | Vwle (~17 V) | Vs (~0 V) | Vs (~0 V) |
| Program | Vcgp (~2 V) | Vs (~0 V) | Vdp0/Vdp1 (~Vs/~Vcc) | Vcc (~5 V) | Vcc (~5 V) | Vs (~0 V) | Vp (~12 V) |
| Read | Vcgr (~4 V) | Vs (~0 V) | Vdr (~2 V) | Vs (~0 V) | Vcc (~5 V) | Vs (~0 V) | Vs (~0 V) |

CONFIGURATION 2

Figure 5B:
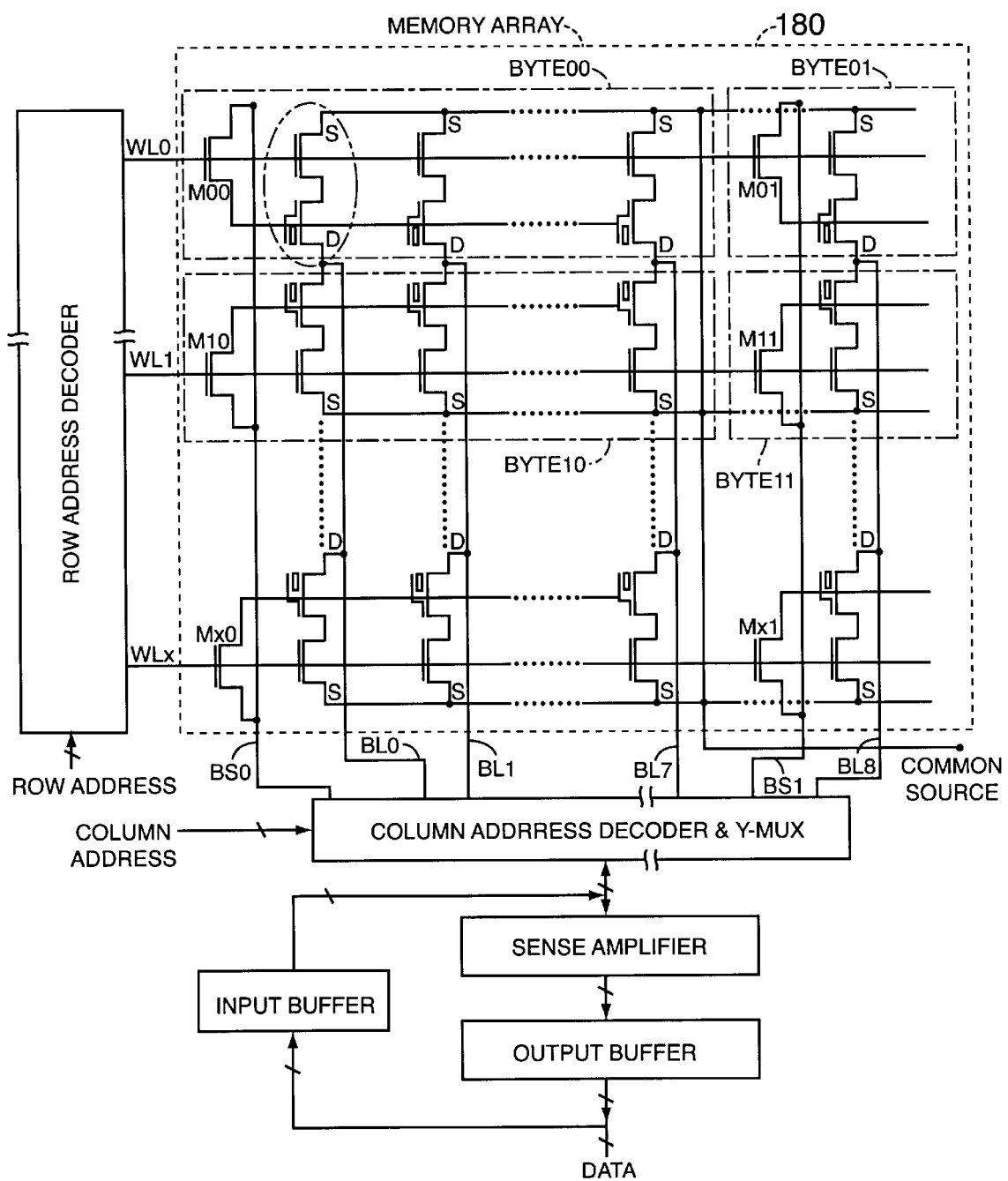
FIG. 5b illustrates a schematic diagram of a memory array of the present invention using a memory cell of the present invention where the select transistor of the memory cell is located away from the floating gate of the storage transistor of the memory cell and is connected as a source terminal at one junction.

Memory Cells Having Select Transistor Placed Away from the Floating Gate and Connected to Source Terminal Referring to FIG. 5b and Table 2b, the corresponding voltage levels to operate a memory array using memory cells with the select transistor located away from the floating gate of the storage transistor and one terminal of the select transistor connected as a source terminal is illustrated.

TABLE 2b

| | Byte-Select (BS) | | Drain (BL) | | Select Gate (WL) | | Source |
|---|---|---|---|---|---|---|---|
| | Select | Non-Select | Select | Non-Select | Select | Non-select | (Common) |
| Erase | Ve (~15 V) | Vs (~0 V) | Vs (~0 V) | Vs (~0 V) | Vwle (~17 V) | Vs (~0 V) | Vs (~0 V) |
| Program | Vcgp (~2 V) | Vs (~0 V) | Vdp0/Vdp1 (Vp = 12/Vs) | Vs (~0 V) | Vwlp (~15 V) | Vs (~0 V) | Vs (~0 V) |
| Read | Vcgr (~4 V) | Vs (~0 V) | Vdr (~2 V) | Vs (~0 V) | Vcc (~5 V) | Vs (~0 V) | Vs (~0 V) |

For the erase and read operations, the voltages are the same as described above. For the program operation of the selected byte-block, BS is at about 2 volts, BL is at the respective programming voltage for the desired logic state, WL is at about 15 volts and source is at ground. WL activates the byte-select transistor. BS being at about 2 volts barely turns on the storage transistor. BL is at the respective voltage level corresponding to the desired logic state. The voltage potential difference between the source and drain terminals of the storage transistor causes injection of the hot electrons from the channel region to the floating gate of the storage transistor.

For all other non-selected byte-blocks, no activity takes place since the voltage potentials are at ground.

CONFIGURATION 3

Figure 5C:
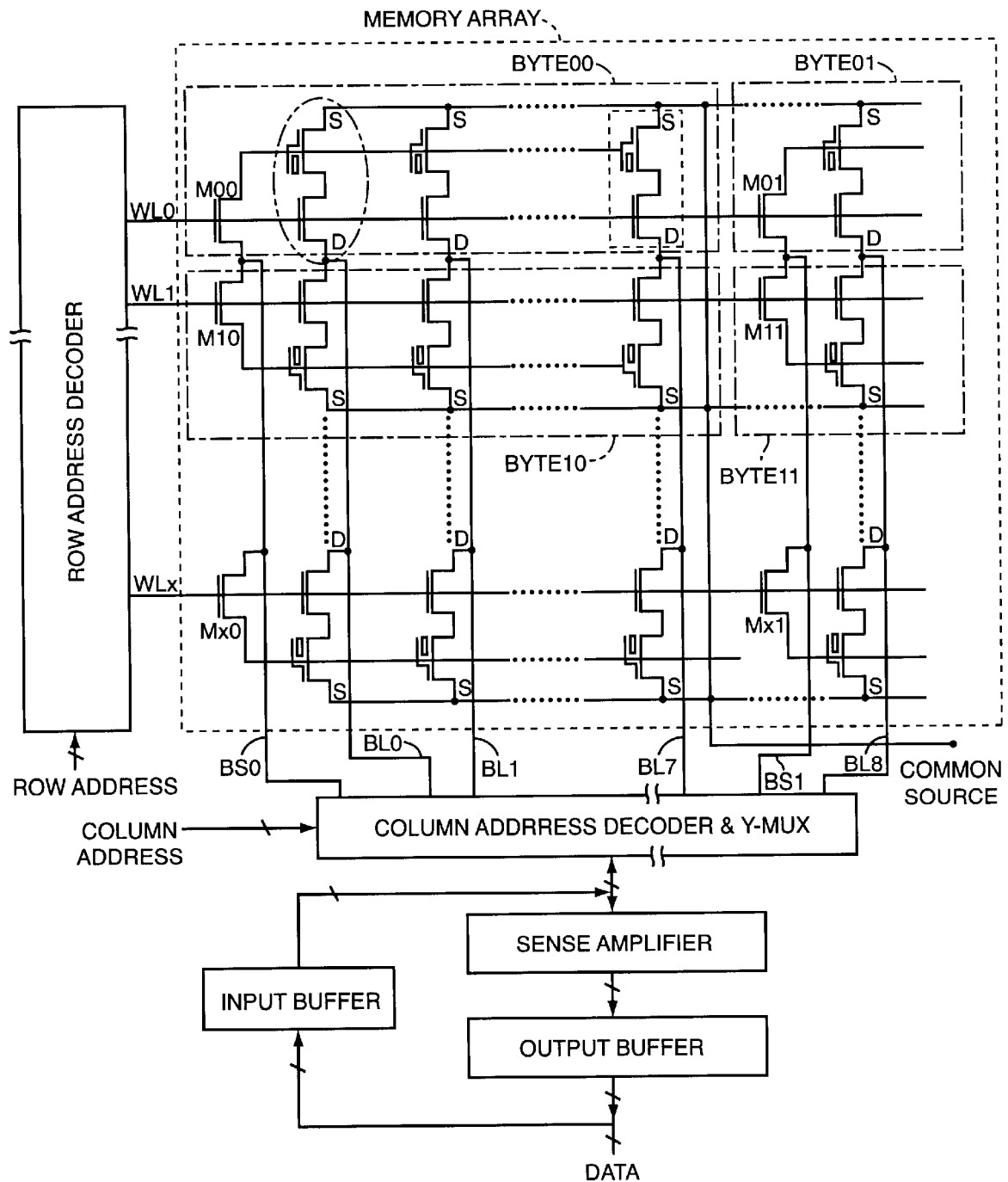
FIG. 5c illustrates a schematic diagram of a memory array of the present invention using a memory cell of the present invention where the select transistor of the memory cell is located near the floating gate of the storage transistor of the memory cell and is connected as a drain terminal at one junction.

Memory Cells Having Select Transistor Placed Near the Floating Gate and Connected to Drain Terminal Referring to FIG. 5c and Table 2c, the corresponding voltage levels to operate a memory array using memory cells having the select transistor placed near the floating gate of the storage transistor, where one terminal of the select transistor designated as a source terminal, is illustrated.

byte-blocks, BS is at about 2 volts, BL is at about 12 volts or Vs, WL is at about 15 volts, and source is at 0 volt. WL activates the byte-select transistor to allow the BS voltage to be applied at the control gates of the storage transistors. BS barely turns on the storage transistors. BL is the respective programming voltage corresponding to the desired logic state. The voltage potential difference between the source and drain terminals causes injection of the electrons in the channel region of the storage transistor to the floating gate of the storage transistor.

For all other non-selected byte-blocks, no activity takes place since the voltage potentials are at ground.

CONFIGURATION 4

Figure 5D:
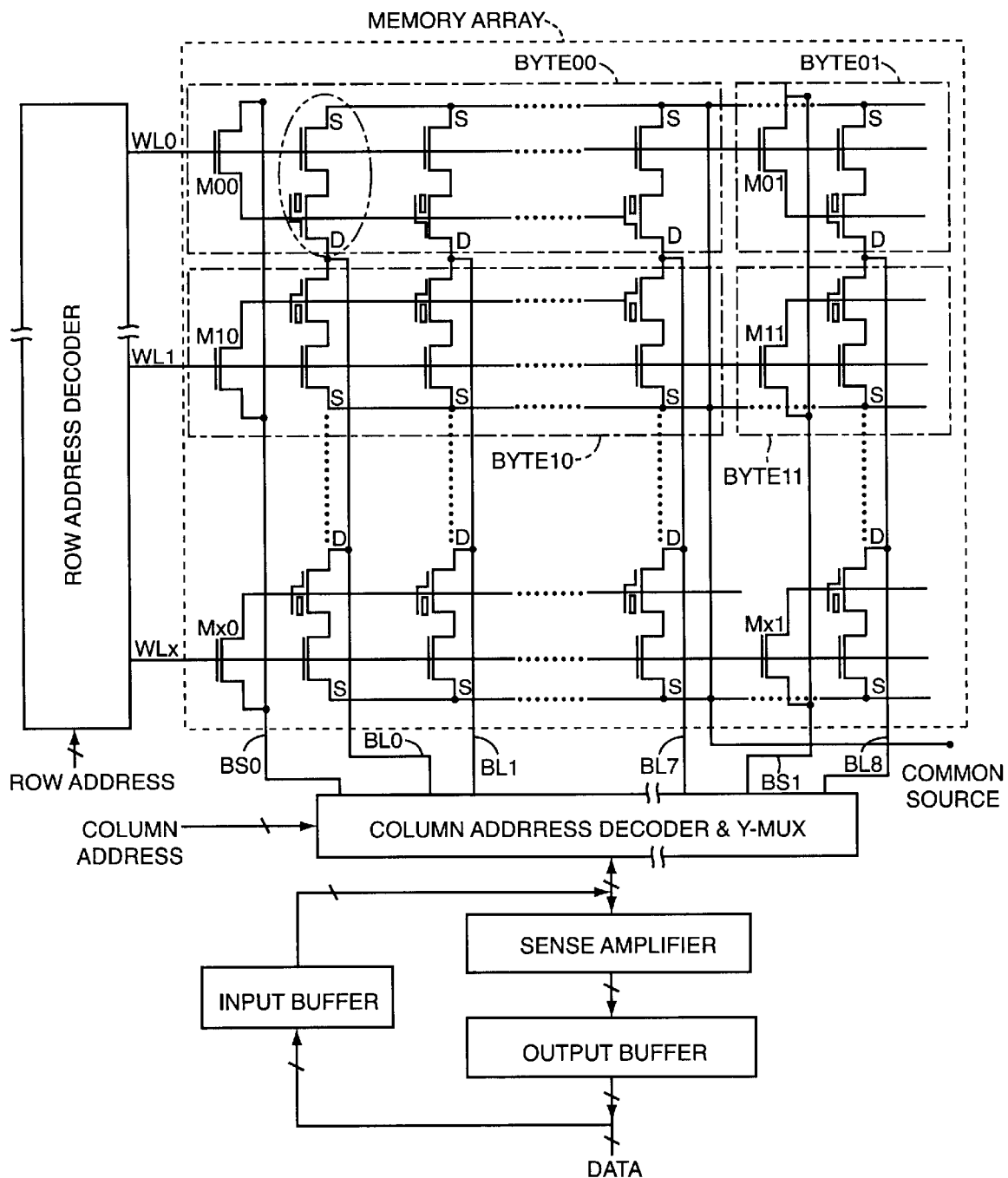
FIG. 5d illustrates a schematic diagram of a memory array of the present invention using a memory cell of the present invention where the select transistor of the memory cell is located near the floating gate of the storage transistor of the memory cell and is connected as a source terminal at one junction.

Memory Cells With Select Transistor Placed Near the Floating Gate and One Terminal of the Select Transistor Connected as a Drain Terminal Referring to FIG. 5d and Table 2d, the corresponding voltage levels to operate a memory array using memory cells having the select transistor located near the floating gate of the storage transistor, and with one terminal of the select transistor connected as a source terminal, is illustrated.

TABLE 2c

| | Byte-Select (BS) | | Drain (BL) | | Select Gate (WL) | | Source |
|---|---|---|---|---|---|---|---|
| | Select | Non-Select | Select | Non-Select | Select | Non-select | (Common) |
| Erase | Ve (~15 V) | Vs (~0 V) | Vs (~0 V) | Vs (~0 V) | Vwle (~17 V) | Vs (~0 V) | Vs (~0 V) |
| Program | Vcgp (~2 V) | VS (~0 V) | Vdp0/Vdp1 (Vp = 12/Vs) | Vs (~0 V) | Vwlp (~15 V) | Vs (~0 V) | Vs (~0 V) |
| Read | Vcgr (~4 V) | Vs (~0 V) | Vdr (~2 V) | Vs (~0 V) | Vcc (~5 V) | Vs (~0 V) | Vs (~0 V) |

The erase and read operations for this configuration are the same as described above. To program the selected TABLE 2d

| | Byte-Select (BS) | | Drain (BL) | | Select Gate (WL) | | Source |
| --- | --- | --- | --- | --- | --- | --- | --- |
| | Select | Non-Select | Select | Non-Select | Select | Non-select | (Common) |
| Erase | Ve (~15 V) | Vs (~0 V) | Vs (~0 V) | Vs (~0 V) | Vwle (~17 V) | Vs (~0 V) | Vs (~0 V) |
| Program | Vcgp (~2 V) | Vs (~0 V) | Vdp0/Vdp1 (~Vs/~Vcc) | Vcc (~5 V) | Vcc (~5 V) | Vs (~0 V) | Vp (~12 V) |
| Read | Vcgr (~4 V) | Vs (~0 V) | Vdr (~2 V) | Vs (~0 V) | Vcc (~5 V) | Vs (~0 V) | Vs (~0 V) |

The erase and read operations for this configuration are the same as described above. To program the selected byte-blocks, BS is at about 2 volts, BL is at about Vs or Vcc, WL is at about 5 volts, and source is at about 12 volts. WL activates the byte-select transistor to allow the BS voltage to be applied at the control gates of the storage transistors. BS barely turns on the storage transistors. BL serves as the respective programming voltage corresponding to the desired logic state. The voltage potential difference between the source and drain terminals causes injection of the electrons in the channel region to the floating gate of the storage transistor.

For the non-selected byte-blocks on the same word line, BL is set to about 5 volts and source is at about 12 volts. For all other non-selected blocks, no activity takes place since the voltage potentials are at ground.

METHOD OF MANUFACTURING

Figure 6:
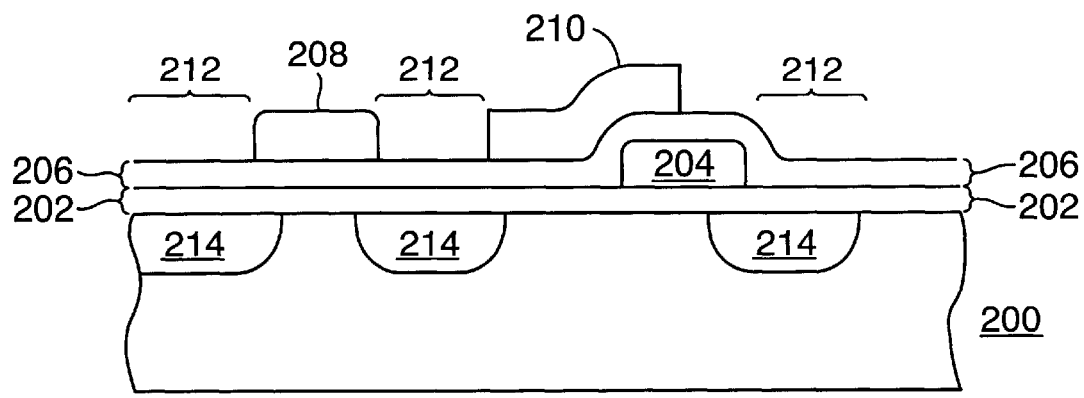
FIG. 6 illustrates a layered cross-section view of a memory cell showing the processing steps in the manufacturing of the same.

Referring to FIG. 6, a layered cross-section view of a memory cell in accordance with the present invention is illustrated to show the processing steps in the manufacturing of the same. As a first step, a substrate 200 of material of a first type is provided. In a second step, the first insulating layer 202 is deposited on the substrate 200. In a third step, a floating gate 204 is disposed on the first insulating layer 202. In a fourth step, a second insulating layer 206 is generally deposited over the first insulating layer 202 and the floating gate 204. In a fifth step, a select gate 208 and a control gate 210 are generally disposed over the second insulating layer 206. In a sixth step, the insulating layers indicated at 212 are generally removed and the regions indicated at 214 is created through diffusion or other methods. It is apparent that there are no additional processing steps involved besides those steps for the creation of the storage transistor.

Figure 7:
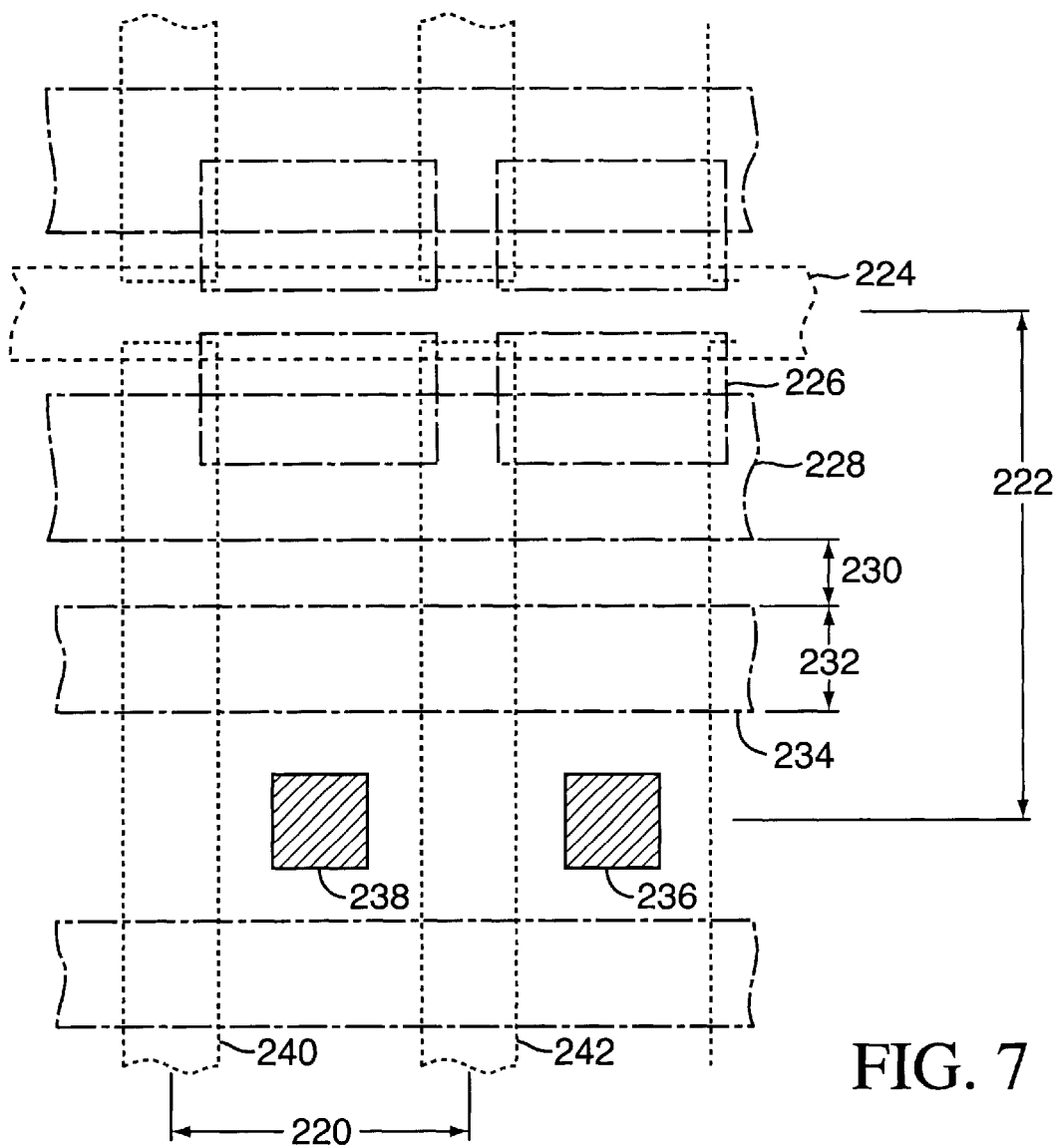
FIG. 7 illustrates a top view of a memory cell in accordance with the present invention.

Referring to FIG. 7, a top view of a physical layout of a memory cell of an embodiment in accordance with the present invention is illustrated. The x-dimension of the cell is indicated at 220 and the y-dimension is indicated at 222. A N+ deep diffusion region serving as a source/drain junction between two cells is indicated at 224. A floating gate (polysilicon 1) is indicated at 226 and a control gate (polysilicon 2) is indicated at 228.

Poly-to-Poly spacing (Lps) is indicated at 230 and poly width (Lpoly) is indicated at 232. A select gate (polysilicon 2) is indicated at 234. Contact pads are indicated by 236 and 238. Field oxide strips are indicated at 240 and 242.

Although the present invention has been described in terms of the presently preferred embodiments, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A method for making an electrically erasable and programmable memory device including a storage cell and a select cell, comprising the steps of:

providing a substrate doped with an element of a first type;

depositing a first insulating layer on said substrate;

forming a floating gate over said first insulating layer, said first insulating layer being suitable for hot carrier injection of charges onto said floating gate;

depositing a second insulating layer over said floating gate and said first insulating layer;

depositing a polysilicon layer over said second insulation layer to form a select gate and a step-shaped control gate, forming first and second regions of a second type for said storage cell of said memory device and a first region of a second type for said select cell of said memory device, said select cell having a second region being either said first or second region of said storage cell;

wherein said select gate is positioned to overlap said first and second regions of said select cell;

wherein said stepped-shaped control gate has a first portion and a second portion, said first portion of said control gate being positioned to partially overlap said second region of said storage cell, said second portion of said control gate being positioned to partially overlap and connect to said first portion of said control gate;

wherein said floating gate is positioned over a portion of said first region of said storage cell and is disposed partially under said second portion of said control gate; and wherein said second insulating layer that is deposited between said floating gate and said control gate is suitable for tunneling of charges from said floating gate to said control gate.

2. A method as recited in claim 1, wherein, when the second region of the select cell is the second region of said storage cell, the said select gate is located closer in proximity to said control gate than said floating gate.

3. A method as recited in claim 1, wherein, when the second region of the select cell is the first region of said storage cell, said select gate is located closer in proximity to said floating gate than said control gate.

4. A method as recited in claim 1, wherein said element of first type is p-type.

5. A method as recited in claim 1, wherein said element of said second type is n-type.

6. A method as recited in claim 3, wherein the second region of the select cell is formed in a shape that is tailored to the special characteristics of the floating gate and the select gate to reduce the channel length of the select transistor and so provide an overall smaller memory device.

7. A method as recited in claim 6, wherein the second region of the select cell is shallower near the position where the select gate partially overlaps the second region of the select cell and is deeper near the position where the floating gate partially overlaps the second region of the select cell.

8. A method as recited in claim 2, wherein the first region of the storage cell is the drain of the memory device and first region of the select cell is the source of the memory device.

9. A method as recited in claim 2, wherein the first region of the storage cell is the source of the memory device and first region of the select cell is the drain of the memory device.

10. A method as recited in claim 3, wherein the second region of the storage cell is the drain of the memory device and first region of the select cell is the source of the memory device.

11. A method as recited in claim 3, wherein the second region of the storage cell is the source of the memory device and first region of the select cell is the drain of the memory device.

* * * * *